United States Patent [19]
Roh

[11] Patent Number: 6,087,233
[45] Date of Patent: Jul. 11, 2000

[54] FORMING TRENCH ISOLATORS IN SEMICONDUCTOR DEVICES

[75] Inventor: Byung-Hyug Roh, Yongin-shi, Rep. of Korea

[73] Assignee: Samsung Electronics Co., Ltd., Kyunnggi-do, Rep. of Korea

[21] Appl. No.: 09/329,844

[22] Filed: Jun. 11, 1999

[30] Foreign Application Priority Data

Jun. 12, 1998 [KR] Rep. of Korea .............. 98-22101

[51] Int. Cl.⁷ .................................. H01L 21/336
[52] U.S. Cl. .................. 438/296; 438/424; 438/437; 438/401; 438/692
[58] Field of Search ................... 438/424, 401, 438/437, 692, 959, 702, 296, 427, 435

[56] References Cited

U.S. PATENT DOCUMENTS

| 5,441,094 | 8/1995 | Pasch ............................. 156/636 |
| 5,780,346 | 7/1998 | Arghavani et al. ............. 438/296 |
| 5,966,614 | 7/1998 | Park et al. ...................... 438/401 |

*Primary Examiner*—Charles Bowers
*Assistant Examiner*—Hsien Ming Lee
*Attorney, Agent, or Firm*—Skjerven, Morrill, MacPherson, Franklin & Friel LLP; Don C. Lawrence

[57] ABSTRACT

A method for forming a trench isolator in a semiconductor substrate comprises: forming a mask layer on the substrate having a opening defining a trench formation region on the substrate; etching the semiconductor substrate through the opening in the mask to form a trench in the substrate; depositing a trench isolation material on the substrate to fill the trench with the isolation material and form a trench isolator in the substrate; planarization-etching the trench isolation material until a top surface of the mask layer is exposed; and, forming a thin protective layer on the surface of the semiconductor substrate. The thin protective layer prevents an edge dipping effect of the trench isolator during subsequent cleaning processes, and enables the planarization-etching to reduce the thickness of the mask layer to the minimum thickness possible, thereby reducing the stresses applied to the semiconductor substrate by the mask layer during subsequent high temperature annealing processes.

10 Claims, 3 Drawing Sheets

FORMING TRENCH ISOLATORS IN SEMICONDUCTOR DEVICES

BACKGROUND OF THE INVENTION

1. Field of the Invention

The present invention relates to a method for fabricating semiconductor devices, and more particularly, to a method for forming trench isolators in semiconductor devices.

2. Description of the Related Art

As the level of integration of semiconductor memory integrated circuits increases, the conventional LOCOS (local oxidation of silicon) process cannot effectively electrically isolate adjacent devices from each other. Accordingly, a "trench isolation" process was introduced for isolating such devices from each other. However, the conventional trench isolation process frequently results in an "edge dipping" effect in the trench isolator material that causes such problems as degradation of gate oxide layers, a "hump" (or "kink") in transistor characteristic curves, and the instability of transistor operation.

FIGS. 1A to 1C sequentially illustrate the conventional method for forming a trench isolator. Referring to FIG. 1A, a silicon nitride mask layer 2 is formed on a pad oxide layer (not shown) on the surface of a semiconductor substrate 1. The masked substrate 1 is then etched to form a trench 3, and an insulating film is deposited on the silicon nitride layer to fill the trench 3. Then, a planarization-etching process is used to remove the insulating film until the top surface of the silicon nitride mask layer 2 is exposed, so that the insulating film in the trench 3 forms a trench isolator 4.

Referring to FIG. 1B, the silicon nitride mask layer 2 is then removed by an $H_3PO_4$ stripping process. After the stripping process, the top surface of the trench isolator 4 projects above the surface of the semiconductor substrate 1 adjacent to the trench 3, that is, above the "active region" of the semiconductor substrate 1, by a thickness t1. The thickness t1, which is typically on the order of 30 to 100 nm, is adjusted as a function of all of the processes, particularly including any erosional wet cleaning processes, that are to be performed on the substrate 1 before any gate deposition steps, such that after all such processes are complete, the top surfaces of the trench isolation layer 4 and the substrate 1 are at the same level, i.e., are coplanar. Thus, the silicon nitride mask layer 2 is not completely removed by the planarization-etching process, and any silicon nitride mask layer 2 remaining on the active region of the substrate 1 can increase the stresses applied to the active region during subsequent manufacturing processes, particularly during any high-temperature annealing processes.

Referring to FIG. 1C, after the silicon nitride layer 2 has been stripped away, a number of photolithographic, cleaning, and other manufacturing processes are typically performed on the substrate 1 for purposes of device fabrication, typically three to six of such iterations, and the cleaning processes involved in these can cause an edge dipping 5 of the trench isolation layer 4, which is about 30 to 100 nm deep. This edge dipping 5 effect must also be taken into consideration in deciding the thickness t1.

As explained by Asanga H. Perera et al. in "Trench Isolation for 0.45 μm Active Pitch and Below", IEDM 95, pp. 28.1.1–28.1.4, 1995, the edge dipping that occurs during formation of a trench isolator may result in the degradation of device characteristics, such as lowered threshold voltages, which can be lowered by as much as 0.1V per 20 nm, "humping" of sub-threshold voltage characteristics, and inferior cut-off characteristics. Such degradation of the device can result in increased power consumption of the device, or in a worst case, can render the device inoperable. Moreover, the lowered threshold voltage and the humping of subthreshold voltage characteristics can make the device's operational characteristics pathologically hypersensitive to even small process changes during device fabrication.

SUMMARY OF THE INVENTION

According to one embodiment of the present invention, a method for forming a trench isolator includes: forming a mask layer on a semiconductor substrate, the mask having an opening defining a trench formation region on the substrate; etching the substrate through the opening in the mask to form a trench in the substrate; depositing a trench isolation material on the substrate to fill the trench with the material; planarization-etching the trench isolation material until a top surface of the mask layer is exposed; and, forming a thin, protective layer on the surface of the semiconductor substrate.

The method can further include annealing the substrate to densify the trench isolation material after its deposition, cleaning the substrate after the formation of the protective layer, and removing the protective layer.

The thin, protective layer prevents edge dipping of the trench isolator from occurring during subsequent cleaning processes, and enables the planarization-etching to reduce the thickness of the mask layer to an amount that is as small as possible, thereby reducing the stresses applied to the semiconductor substrate by the mask layer during any subsequent high-temperature annealing processes.

BRIEF DESCRIPTION OF THE DRAWINGS

The features and advantages of the invention will be better understood by reference to the following detailed description, and to the accompanying drawings, wherein.

DETAILED DESCRIPTION OF THE INVENTION

Figure 1A:
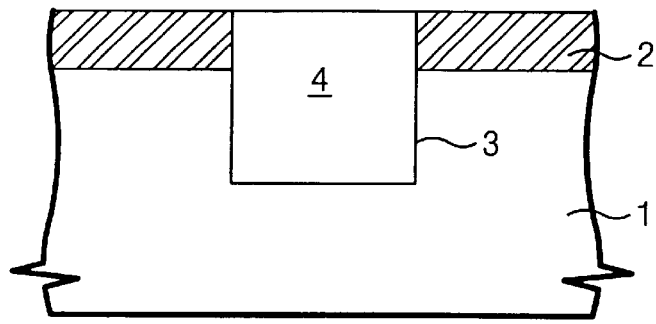
FIGS. 1A to 1C are sectional views of a semiconductor device illustrating the conventional method for forming a trench isolator therein; and, FIGS. 2A to 2D are sectional views of a semiconductor device illustrating a method for forming a trench isolator therein according to an embodiment of the present invention.
Figure 1B:
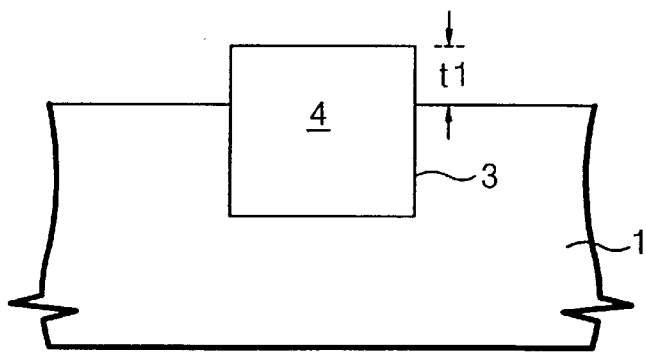
Figure 1C:
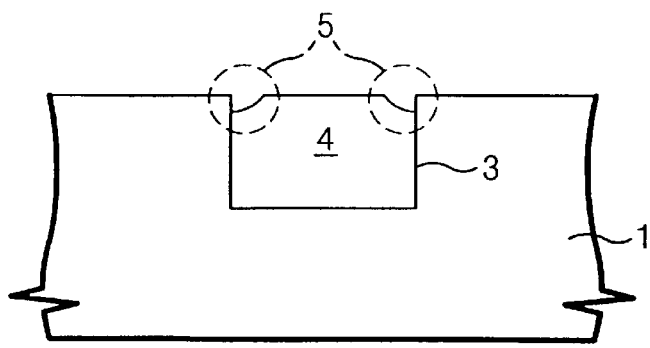
Figure 2A:
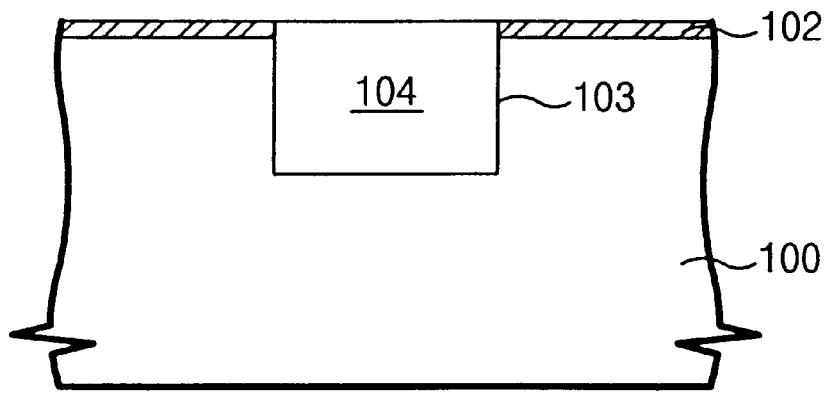

FIGS. 2A to 2D illustrate a method for forming a trench isolator in a semiconductor device according to an embodiment of the present invention. Referring to FIG. 2A, a silicon nitride mask layer 102 is formed on a pad oxide layer (not shown) formed on a semiconductor substrate 100, so that a portion of the semiconductor substrate 100 (or the pad oxide layer) for the trench isolator is exposed through the silicon nitride mask layer 102. Importantly, the silicon nitride mask layer 102 of the present invention is thinner than conventional silicon nitride mask layers. The conventional silicon nitride mask layers are typically 1500~2500 Å thick, whereas, the silicon nitride mask layer 102 according to the present invention is only about 500~1500 Å thick. Being thinner than the conventional silicon nitride mask layers, the thin silicon nitride mask layer 102 of the present invention applies less stress to the active region of the substrate 100 during subsequent high-temperature annealing processes than do the conventional, thick silicon nitride mask layers.

After the silicon nitride mask layer 102 is formed, the substrate 100 is etched through the openings in the mask to form an isolation trench 103 in the substrate below the openings. Then, an insulating material, such as an undoped silicate glass ("USG") oxide is deposited on the silicon nitride mask layer 102 such that the trench 103 is entirely filled with it, defining a trench isolator 104 in the substrate 100. The substrate is then annealed, at a temperature of about 1000° C., to densify the trench isolator 104 and prevent its attrition (or etching-away) during a subsequent wet-cleaning of the substrate 100. The high temperature annealing process also relieves the stresses applied to the semiconductor substrate 100 by the silicon nitride mask layer 102.

The annealing process is followed by a planarization-etching of the insulating material. For example, a chemical/mechanical ("CMP") polishing process is preferably used to remove the insulating material until the top surface of the silicon nitride mask layer 102 is exposed, leaving only the insulating material in the trench 103 to form the trench isolator 104. The planarization-etching can further remove the silicon nitride mask layer 102 down to a thickness of less than 1000 Å. Conventional trench isolation formation methods do not etch the silicon nitride mask layer to such a thinness.

Figure 2B:
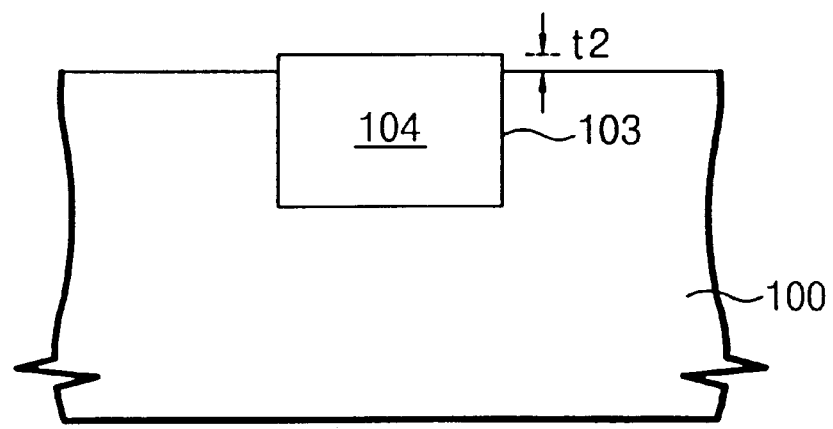

Referring to FIG. 2B, the silicon nitride mask layer 102 is stripped off using an $H_3PO_4$ etch, leaving the top surface of the trench isolator 104 elevated above the adjacent active region of the semiconductor substrate 100 by a height, or thickness, of t2. However, because of the thinness of the silicon nitride mask layer 102 used in this invention, the height t2 of the trench isolator 104 above the active region can be controlled to be as small as about 0–500 Å.

Figure 2C:
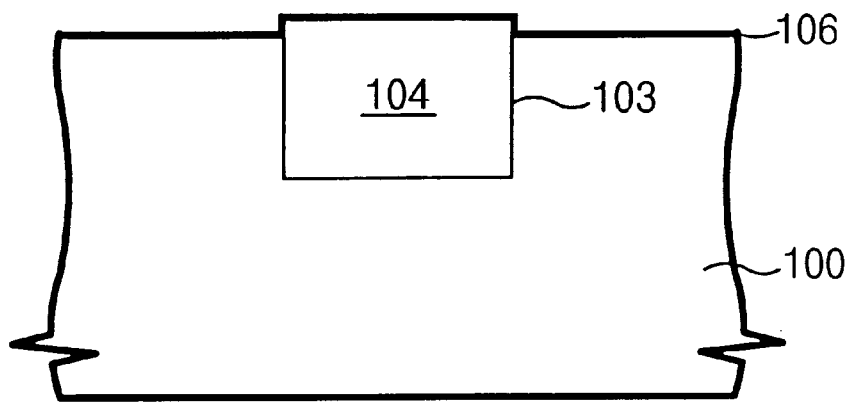

As shown in FIG. 2C, a thin protective layer 106 is then formed over the surface of the semiconductor substrate 100 to prevent attrition of the material of the trench isolator 104 during subsequent semiconductor substrate 100 wet-cleaning procedures. A low pressure chemical vapor deposition process ("LPCVD") is preferably used to form the protective layer 106 of a chemically and physically stable material, such as silicon nitride, or polysilicon, to a thickness of several nm.

Thus, for example, to implement a retrograde well-scheme on the semiconductor substrate 100, a well-ion implantation process and a threshold-adjust-ion implantation process are sequentially performed on the substrate. These ion implantation processes both involve a series of reiterative photolithography, ion implantation, ashing, stripping, and cleaning steps. Thus, from three to six cleaning steps are performed on the substrate 100 during this sequence. During each of these cleaning steps, the protective layer 106 serves to eliminate or greatly reduce the amount of the attrition of the insulation material of the trench isolation 104.

Figure 2D:
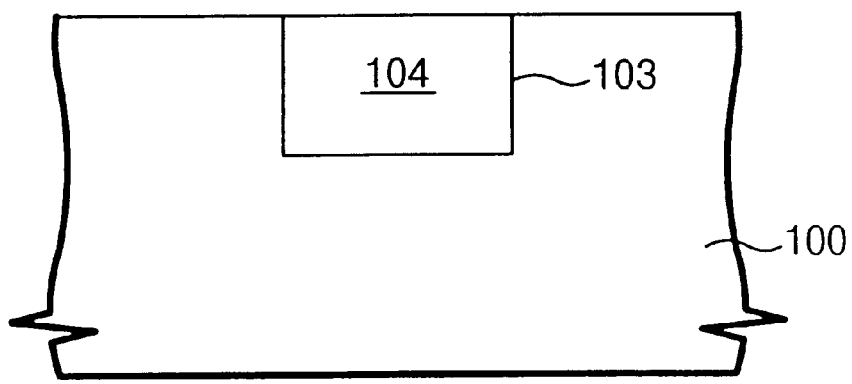

After the ion implantation processes are complete, the protective layer 106 is removed from the substrate, preferably with an $H_3PO_4$ stripping process, as shown in FIG. 2D, and the top surface of the trench isolator 104 is disposed at the same level as that of the adjacent active region of the semiconductor substrate 100. That is, the protective layer 106 reduces the degree of the trench isolation edge dipping to less than 30 nm.

In summary, a protective layer formed on a semiconductor substrate can prevent or reduce unwanted etching (or attrition) and edge dipping of a trench isolator during subsequent cleaning processes. Moreover, due to the reduced etching-away of the trench isolator material, the thickness of the initial deposition of a mask layer material for trench isolation etching can be substantially reduced, thereby decreasing the stresses applied to the underlying semiconductor substrate by the mask layer during high-temperature annealing and stabilizing the operational characteristics of semiconductor devices formed on the substrate.

In general, whenever a structure formed on a semiconductor substrate can be undesirably etched by a subsequent wet cleaning operation, the protective layer described above can be formed on the substrate to reduce the degree of etching of the structure.

Although the invention has been described with reference to particular embodiments, the description is only an example of the inventor's application and should not be taken as a limitation. Various adaptations and combinations of the features of the embodiments disclosed herein are within the scope of the invention, as defined by the following claims.

What is claimed is:

1. A method for forming a trench isolator in a semiconductor substrate, comprising:

forming a mask layer on the substrate, the mask layer having an opening through it exposing a portion of the substrate and defining the location of the trench isolator on the substrate;

etching the substrate through the opening in the mask layer to form a trench in the semiconductor substrate;

depositing an insulating material on the semiconductor substrate to fill the trench with the insulating material and form an insulating layer thereof;

planarization-etching the insulating layer until a top surface of the mask layer is exposed;

removing the mask layer to expose a step difference between the insulating layer and the substrate; and, forming a protective layer on the semiconductor substrate that prevents etching-away of the insulating material in the trench isolator during subsequent cleaning processes performed on the substrate.

2. The method according to claim 1, wherein the mask layer comprises a silicon nitride layer.

3. The method according to claim 1, wherein the planarization-etching further comprises removing a portion of the mask layer until the mask layer remaining on the substrate is reduced to a thickness of between about 0–1000 Å.

4. The method according to claim 1, wherein the protective layer is made of one selected from a group consisting a silicon nitride and a polysilicon.

5. The method according to claim 1, wherein the protective layer is several nm thick.

6. The method according to claim 1, further comprising annealing the semiconductor substrate after forming the insulating layer.

7. The method according to claim 6, wherein the annealing is performed at a temperature of about 1000° C.

8. The method according to claim 1, further comprising:

cleaning the semiconductor substrate after forming the protective layer; and, removing the protective layer.

9. The method according to claim 1, wherein the step difference is less than 500 Å thick.

10. The method according to claim 1, wherein the mask layer is formed to a thickness of less than 1500 Å.

* * * * *